United States Patent [19]

Kinoshita

[11] 4,433,257
[45] Feb. 21, 1984

[54] VOLTAGE SUPPLY FOR OPERATING A PLURALITY OF CHANGING TRANSISTORS IN A MANNER WHICH REDUCES MINORITY CARRIER DISRUPTION OF ADJACENT MEMORY CELLS

[75] Inventor: Hiroyuki Kinoshita, Tokyo, Japan

[73] Assignee: Tokyo Shibaura Denki Kabushiki Kaisha, Japan

[21] Appl. No.: 237,699

[22] Filed: Feb. 24, 1981

[30] Foreign Application Priority Data

Mar. 3, 1980 [JP] Japan ................................. 55-26415
Apr. 3, 1980 [JP] Japan ................................. 55-43870

[51] Int. Cl.³ ...................... H03K 3/013; H03K 17/16
[52] U.S. Cl. .................................. 307/443; 307/238.3; 307/449; 365/203
[58] Field of Search ................... 307/443, 448–453, 307/238.2, 238.3; 365/149, 183–186, 203, 206, 227; 377/58

[56] References Cited

U.S. PATENT DOCUMENTS

| | | | |
|---|---|---|---|
| 3,805,095 | 4/1974 | Lee et al. ........................ | 307/443 X |
| 3,893,146 | 7/1975 | Heeren ............................ | 365/149 X |
| 3,898,479 | 8/1975 | Proebsting ...................... | 307/205 |
| 4,047,051 | 9/1977 | Heller .............................. | 377/58 |
| 4,100,430 | 7/1978 | Lesser .............................. | 307/453 |
| 4,163,245 | 7/1979 | Kinoshita ........................ | 357/51 |
| 4,164,751 | 8/1979 | Tasch, Jr. ........................ | 365/149 X |

*Primary Examiner*—Larry N. Anagnos
*Assistant Examiner*—David R. Hudspeth
*Attorney, Agent, or Firm*—Finnegan, Henderson, Farabow, Garrett & Dunner

[57] ABSTRACT

A MOS integrated circuit device comprises a plurality of charge retention circuit elements formed on a semiconductor substrate and a peripheral circuit having charging transistor formed on the semiconductor substrate and positioned near to the charge retention circuit elements. The device further comprises a circuit which is formed on the semiconductor substrate and which supplies a first voltage to the gate electrode of each charging transistor and a second voltage to the drain electrode of each charging transistor. The first voltage and the second voltage cooperate to make each charging transistor operate in a triode region for a predetermined time, thereby preventing the charge retention characteristics of the charge retention circuit elements from being degraded.

29 Claims, 22 Drawing Figures

VOLTAGE SUPPLY FOR OPERATING A PLURALITY OF CHANGING TRANSISTORS IN A MANNER WHICH REDUCES MINORITY CARRIER DISRUPTION OF ADJACENT MEMORY CELLS

This invention relates to a MOS type integrated circuit device with improved charge retention characteristics.

A MOS type integrated circuit device (hereinafter called "MOS-IC") has a charge retention portion which comprises capacities or stray condensers of MOS transistors for holding charge. In some of the MOS-ICs of this type a signal of logic level "1" corresponds to the state such that their charge retention potions hold charge and a signal of logic level "0" corresponds to the state such that their charge retention portions hold no charge. Typical examples of such MOS-ICs are a dynamic type random access memory (d-RAM) and a shift register, etc.

Charge accumulated in the charge retention portion of a MOS-IC of the above-mentioned structure is gradually lost as current leaks at the PN junctions, etc. A similar current leak takes place in a static type MOS memory and the like in which charge is held in a load made of polycrystalline silicon or the like and having a resistance of 10 MΩ or more. The leak current may become large enough to destroy the data stored in the MOS memory, thus causing the MOS memory to operate erroneously. Thus it is essential that the leak current should be reduced thereby to minimize the charge loss in MOS-ICs.

Now it will be studied how charge dissipates in MOS-ICs. The charge retention portion (i.e. group of memory cells, etc.) of a MOS-IC and its peripheral circuits are formed on the same substrate. The charge retention characteristics of the charge retention portion therefore depends on the characteristics of the transistors which constitute the peripheral circuits.

FIG. 1 illustrates how charge which dissipates from a charge retention portion, is affected by a transistor of a peripheral circuit formed on the same substrate as is the charge retention portion. As shown in FIG. 1, on a semiconductor substrate 32 of a one conductivity type there is formed a charge retention portion 34. The charge retention portion 34 is a condenser which comprises the substrate 32, an electrode 36 and an insulation layer 38. The electrode 36 is laid partly on the substrate 32 and partly on the insulation layer 38. In the substrate 32 a diffusion layer 40 of the opposite conductivity type is formed in contact with the electrode 36 so as to actuate the charge retention portion 34. Formed also on the semiconductor substrate 32 is a MOS transistor 42 of a peripheral circuit (e.g. decoder, sense amplifier), which is positioned near the charge retention portion 34. The transistor 42 comprises a drain region 44 of the opposite conductivity type, a drain electrode 45, a gate electrode 46, a source region 48 of the opposite conductivity type, a source electrode 49 and an insulation layer 50.

When the MOS transistor 42 does not operate at all or is operating in a triode region (gate voltage > drain voltage − threshold voltage), the charge of the condenser 34 is gradually lost only by the leak current in the diffusion layer 40, but not by influence of the MOS transistor 42 of the peripheral circuit. In the case the charge retention portion 34 retains charge for about 1 to 10 seconds at room temperature. However, when the MOS transistor 42 operates in a pentode region (gate voltage < drain voltage − threshold voltage), a depletion layer 54 is formed between the drain region 44 and the channel region of the transistor 42. Impact ionization takes place in the depletion layer 54, thereby producing electron-hole pairs 56. As a result, more and more carriers are produced. Some of the carriers thus produced are injected as minority carriers into the semiconductor substrate 32. The carriers are diffused in the substrate 32 to reach the diffusion layer 40. Ultimately, they are trapped in the charge retention portion 34. Consequently, the leak current in the charge retention portion 34 increases to cause a rapid loss of the charge held in the charge retention portion 34. In this case, the charge retention portion 34 retains charge for about 1 to 100 msec. at room temperature. The charge retention time is 10 to 1,000 times shorter than when the loss of charge is caused by the leak current in the diffusion layer 40 alone.

A memory-IC 30 in practical use has, as shown in FIGS. 2 to 4, row decoders RC and circuits CC comprised of column decoders, sense amplifiers, data control circuits, etc. The row decoders RC and the circuits CC are arranged in the vicinity of memory cells MC which hold charge. Further, peripheral circuits PC such as a clock generator, an address buffer and an input and output circuit are so arranged as to sandwich the combination of the row decoders RC, the circuits CC and the memory cells MC.

More specifically, FIG. 2 shows a memory-IC in which memory cells MC are not separated into groups, FIG. 3 shows a memory-IC in which memory cells MC are separated into two groups, and FIG. 4 illustrates a memory-IC in which memory cells are separated into four groups. Of course, there are practically used other modifications of memory-ICs. In any of these memory-ICs a row decoder or decoders RC and a circuit or circuits CC including column decoders are positioned very near the memory cells, i.e. the charge retention portion.

FIG. 5 is a circuit diagram of a typical known row or column decoder. The decoder comprises a charging transistor $T_1$ and discharging transistors $T_{11}$ to $T_{n1}$. The discharging transistors $T_{11}$ to $T_{n1}$ are driven by address signals $A_1$ to $A_n$, respectively. When the decoder is selected, it produces an output of level "1" at an output terminal $O_1$. When it is not selected, it produces an output of level "0" at the output terminal $O_1$. The output terminal $O_1$ of the decoder is connected to a memory cell section through a control circuit 60 or buffer circuit 60. The drain electrode of the charging transistor $T_1$, which is an enhancement type is connected to receive a high power source voltage $V_{DD}$, and the gate electrode thereof is connected to receive a clock signal $\phi$ or the high power source voltage $V_{DD}$. The power source voltage $V_{DD}$ is applied to the gate electrode of the transistor $T_1$ thereby to turn on the transistor $T_1$ for two reasons. First, no power source needs to be provided exclusively for the transistor $T_1$. Secondly, it is easier to generate a clock pulse than otherwise. The output terminal $O_1$ is charged to $V_{DD} - V_{th}$, where $V_{th}$ denotes the threshold voltage of the charging transistor $T_1$. This suffices to operate the decoder. Thus, whenever the decoder is charged, the charging transistor $T_1$ is driven in a pentode region and minority carriers are injected into the substrate by impact ionization.

A number of such decoders as shown in FIG. 5 are used in a memory-IC. For instance, a memory-IC of 16K bits (128 rows×128 columns) has 256 decoders in all. Minority carriers which are generated in the decoders amount to an enormous number. Moreover, a large number of minority carriers reach the memory cell sections MC (or charge retention portion) inevitably because the decoders are positioned very close to the memory cell sections MC as illustrated in FIGS. 2 to 4. Consequently, the minority carriers degrade the charge retention characteristics of the memory cell sections MC to a marked degree.

The data lines, sense amplifiers and address buffers of a memory-IC are provided with charging transistors which are positioned near the memory cell sections of the memory-IC. The drain and gate electrode of each of these transistors are connected to receive a power source voltage $V_{DD}$. Each charging transistor is charged to $V_{DD}-V_{th}$. Also in these charging transistors minority carriers are generated, eventually degrading the charge retention characteristics of the memory cell sections to a marked degree.

A method to prevent the charge retention characteristics of memory cell sections from being degraded by minority carriers, is disclosed in U.S. Pat. No. 4,163,245 of which the inventor of this invention is the patentee. The method consists in providing a diffusion region which surrounds a charge retention portion at least in part and applying an extremely high voltage onto the diffusion layer thereby to trap minority carriers in the diffusion layer.

According to this invention, the structure of a MOS-IC is so designed as to suppress the generation of minority carriers in the vicinity of the charge retention portion of the MOS-IC. This technique of this invention may be combined with the technique of U.S. Pat. No. 4,163,245, thereby more effectively preventing the charge retention characteristics of the MOS-IC from being degraded.

It is an object of this invention to provide a MOS type integrated circuit device (MOS-IC) which has good charging characteristics and which has its charge retention characteristics improved without sacrificing its good charging characteristics.

A MOS-IC according to this invention comprises a semiconductor substrate, a plurality of charge retention circuit elements formed on the substrate and a plurality of peripheral circuits having charging transistors provided in the vicinity of the charge retention circuit elements to achieve the above-mentioned object of the invention, the MOS-IC further comprises means which is formed on the semiconductor substrate and which applies a first voltage to the gate electrodes of the charging transistors and a second voltage to the drain electrodes of the charging transistors. The first and second voltages cooperate to drive the charging transistors in a triode region for a predetermined time, thereby to prevent the charge retention characteristics of the charge retention circuit elements from being degraded.

The drain electrodes of the charging transistors are not supplied directly with a high power source voltage. Rather, they are supplied with a voltage which is lower than the power source voltage and which has been generated within the semiconductor chip at portions located substantially away from the charge retention circuit elements. Alternatively, they may be supplied with a pulsating voltage which is delayed more than a gate drive pulse for the charging transistors, which is lower than the voltage of the gate drive pulse by about the threshold voltage of the charging transistors and which has been generated within the semiconductor chip at portions located substantially away from the charge retention circuit elements. Whichever voltage, the lower voltage or the pulsative voltage, is applied to the drain electrodes of the charging transistors, the above-mentioned object of the invention will be accomplished.

With the MOS-IC of the above-described structure it is possible to suppress the generation of minority carriers in the peripheral circuits which are provided close to the charge retention circuit elements. Thus, the charge retention characteristics of the charge retention circuit elements can be drastically improved.

The above-mentioned voltage supply means may be located at a proper distance from the charge retention circuit elements and may be used to supply voltages to a plurality of the charging transistors. If this is the case, it becomes easier to design the MOS-IC because the source of minority carriers can be limited to a few portions of the semiconductor substrate.

Further, a diffusion layer may be formed to surround at least one portion of the voltage supply means as disclosed in U.S. Pat. No. 4,163,245 or to surround entirely the voltage supply means, and then the highest voltage available in the MOS-IC may be applied onto the diffusion layer thereby to trap in the diffusion layer the minority carriers generated by the voltage supply means. This technique will help achieve the object of the invention even more effectively.

Other objects and advantages of the invention will become apparent from the following detailed description when taken in conjunction with the accompanying drawings.

Figure 6:
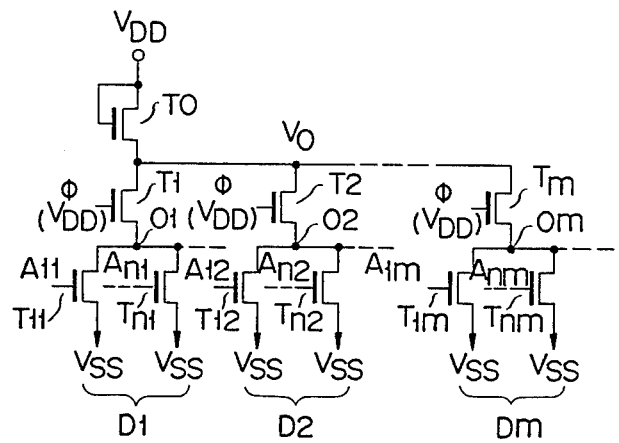
FIG. 6 is a circuit diagram of a decoder circuit used in an embodiment of this invention.

FIG. 6 shows a decoder circuit which is a peripheral circuit to the charge retention portion of a MOC-IC according to this invention and which is formed on the semiconductor substrate of the MOS-IC. As shown in FIG. 6, the decoder circuit comprises decoders $D_1$, $D_2$, ..., $D_m$. The decoder $D_1$ includes an enhancement type transistor $T_1$ for charging an output terminal $O_1$ and enhancement type transistors $T_{11}$ to $T_{n1}$ for discharging the output terminal $O_1$. The decoder $D_2$ includes an enhancement type transistor $T_2$ for charging an output terminal $O_2$ and enhancement type transistors $T_{12}$ to $T_{n2}$ for discharging the output terminal $O_2$. Similarly, the decoder $D_m$ includes an enhancement type transistor $T_m$ for charging an output terminal $O_m$ and enhancement type transistors $T_{1m}$ to $T_{nm}$ for discharging the output terminal $O_m$. The other decoders $D_3$ to $D_{m-1}$ (not shown) have similar structure. The charging transistors $T_1$ to $T_m$ are driven by a clock pulse $\phi$ of which "1" voltage is a high power source voltage $V_{DD}$. "1" voltage denotes a voltage which turns a MOS transistor on. Alternatively, they may be driven by the power source voltage $V_{DD}$. The discharging transistors $T_{11}$ to $T_{1m}$ are driven respectively by address signals $A_{11}$ to $A_{1m}$, and the discharging transistors $T_{n1}$ to $T_{nm}$ are driven respectively by address signals $A_{n1}$ to $A_{nm}$.

Figure 1:
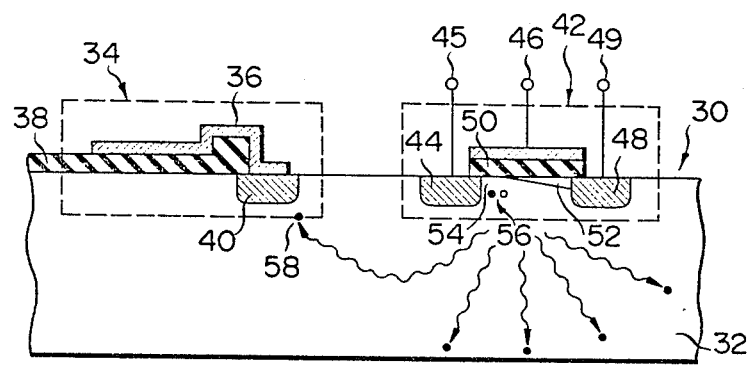
FIG. 1 is a cross sectional view of a MOS-IC, illustrating how charge is lost.
Figure 2:
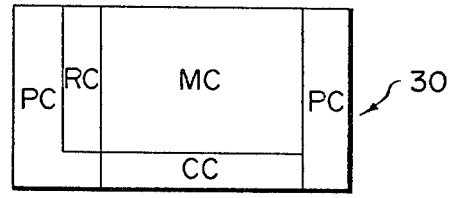
FIG. 2 is a schematic plan view of a conventional MOS-IC, showing the chip layout thereof.
Figure 3:
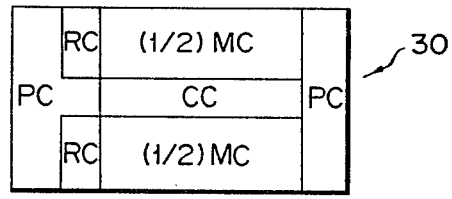
FIG. 3 is a schematic plan view of another conventional MOS-IC, showing the chip layout thereof.
Figure 4:
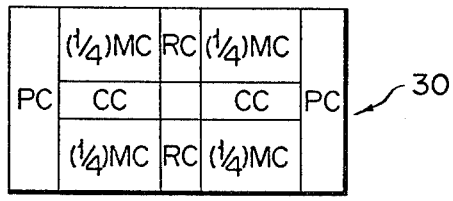
FIG. 4 is a schematic plan view of still another conventional MOS-IC, showing the chip layout thereof.
Figure 5:
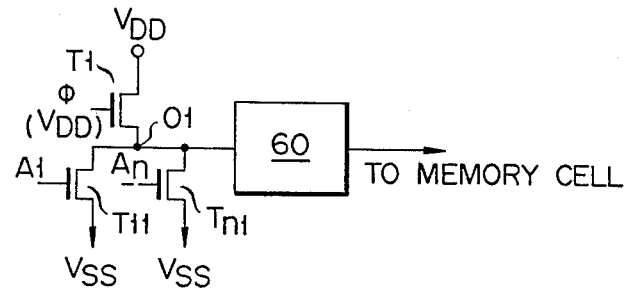
FIG. 5 is a circuit diagram of a conventional decoder.

As far as the structure thus mentioned is concerned, the decoder circuit is similar to the known decoder shown in FIG. 5. The decoder circuit is characterized by an enhancement type power source transistor $T_0$. The power source transistor $T_0$ is provided far from the charge retention portion of the MOS-IC. It is so connected that its source voltage $V_0$ is supplied to the drain electrodes of the charging transistors $T_1$ to $T_m$. It is preferred that the power source transistor $T_0$ have trans conductance $g_m$ which is larger than that of the charging transistors $T_1$ to $T_m$ so that the characteristics of the charging transistors $T_1$ to $T_m$ would not be degraded.

In spite of the power source transistor $T_0$ thus provided, the "1" level voltage of each decoder may be elevated to "$V_{DD}-V_{th}$", where $V_{th}$ is the threshold voltage of the charging transistors $T_1$ to $T_m$. So the "1" level voltage functions practically and the charging characteristic of the decoder circuit is substantially the same as that of the known decoder.

The drain voltage of the charging transistors $T_1$ to $T_m$ is "$V_{DD}-V_{th}$", and the gate voltage thereof is "$V_{DD}$". The transistors $T_1$ to $T_m$ therefore operate in a triode region. Generation of minority carriers due to impact ionization is thus successfully suppressed, thus much improving the charge retention characteristics of the memory cells incorporated in the MOS-IC. Indeed, minority carriers are generated as the transistors $T_1$ to $T_m$ operate in a pentode region when the voltage of the clock pulse $\phi$ rises from the lowest level to the highest level $V_{DD}$. However, the clock pulses $\phi$ rises up faster than the decoders $D_1$, $D_2$, ..., $D_m$ are charged, and the charging transistors $T_1$ to $T_m$ operate in a pentode region but for a very short time. Should the transistors $T_1$ to $T_m$ operate in a pentode region for a relatively long time, far less minority carriers would be generated than in the known decoder. This is because the drain voltage of each charging transistor is reduced while the transistor is operating in a pentode region, and the depletion layer formed between the drain electrode and channel of the transistor generates but a weak electric field. The number of minority carriers exponentially increases in accordance with the intensity of the electric field generated by the depletion layer. This means that the number of minority carriers generated by impact ionization can be reduced very much in the decoder circuit shown in FIG. 6.

Figure 7:
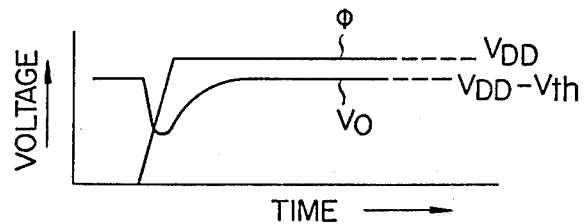
FIG. 7 is a waveform chart illustrating the relationship between the gate voltage and drain voltage of a charging transistor incorporated in the decoder shown in FIG. 6.

If the conductance $g_m$ of the power source transistor $T_0$ is made relatively small, the drain voltage $V_0$ of the charging transistors $T_1$ to $T_m$ will become much lower than "$V_{DD}-V_{th}$" as shown in FIG. 7 when the transistors $T_1$ to $T_m$ are charged. This is much desirable because if the drain voltage $V_0$ is so lowered, the charging transistors $T_1$ to $T_m$ keep operating in a triode region for a greater part of the period during which the level of the clock pulse $\phi$ rises to $V_{DD}$.

Suppose that the decoders of the decoder circuits shown in FIG. 6 are of dynamically-driven type. Then, the discharging transistors may operate in a pentode region just like the charging transistors while the unselected decoders are discharged to "0" voltage. But the discharging transistors so operate for a very short time and their drain voltage (i.e. output voltage of the decoders) is rapidly reduced to "0" voltage. For this reason, far less minority carriers are generated, if any, in the discharging transistors than in the charging transistors $T_1$ to $T_m$.

It will now be discussed how far the charging transistors of a peripheral circuit should be provided from the charge retention portion of the MOS-IC so that they affect the charge retention characteristics of said portion as little as possible.

The number n of minority carriers reaching the charge retention portion of the MOS-IC, e.g. memory cells, is expressed as: $n \propto e^{-x/L}$, where x is the distance between the memory cells and the position where minority carriers are generated and L is diffusion length. Diffusion length L is represented by $\sqrt{D\tau}$, where D is diffusion constant and $\tau$ is life time. When charging transistors $T_1$ to $T_m$ are of N channel type and driven at room temperature, $D \approx 35$ cm²/sec, $\tau \approx 10$ to 100 μs, and thus $L \approx 20$ to 60μ.

As mentioned before, the charge retention time of the charge retention portion is reduced to about 1/10 to 1/1,000 when minority carriers are generated. In view of this, it is necessary to allow only 1/10,000 or less of the minority carriers generated to reach the charge retention portion. If the charging transistors $T_1$ to $T_m$ are of N channel type and driven at room temperature and thus if $L \approx 20$ to 60μ, the distance x between the memory cells and the source of minority carriers must be: $X \approx 200$–600μ. In practice, therefore, if the charging transistors of a peripheral circuit which are charged with a threshold loss are provided at a distance of less than about 500μ from the memory cells, they will degrade the charge retention characteristic of the charge retention portion.

Figure 8:
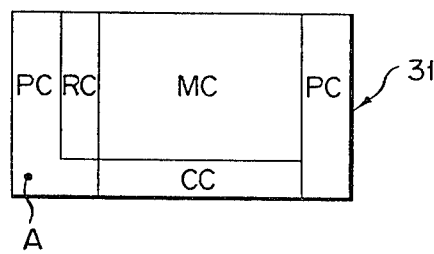
FIG. 8 is a schematic plan view of an embodiment of this invention, illustrating the chip layout thereof and indicating the position of a voltage supply transistor incorporated in the decoder of FIG. 6.

In the decoder circuit of FIG. 6, the power source transistor $T_0$ operates always in a pentode region and the current flowing through it is large. The transistor $T_0$ therefore works inevitably to increase the number of minority carriers. Suppose the power source transistor $T_0$ is located, as shown in FIG. 8, at point A which is at a considerably long distance, e.g. 500μ or more, from the charge retention portion MC. Then, the minority carriers generated by the transistor $T_0$ recombine while diffusing in the substrate. Therefore, only an extremely small number of minority carriers reach the charge retention portion MC and the transistor $T_0$ does not affect the charge retention characteristic of the portion MC. Instead of providing the power source transistor $T_0$ at such a long distance from the portion MC, a diffusion layer may be formed to surround the transistor $T_0$ and a high voltage, e.g. $V_{DD}$, may be supplied to the diffusion layer thereby to trap the minority carriers in the diffusion layer, as is disclosed in U.S. Pat. No. 4,163,245. This method is advantageous because the positioning of the transistor $T_0$ is not restricted at all.

Figure 9:
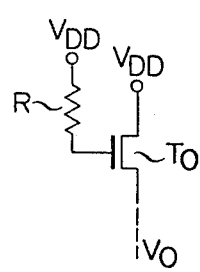
FIG. 9 is a circuit diagram of voltage supply means according to this invention.

The charging transistors $T_1$ to $T_m$ of the decoder circuit shown in FIG. 6 may be supplied with voltage $V_0$ by such a voltage supply means as shown in FIG. 9. The voltage supply means comprises a resistor R of a high resistance which is connected in series to the gate electrode of the power source transistor $T_0$. The resistor R suppresses the change of the output voltage $V_0$ of the transistor $T_0$ which results from the change of power source voltage $V_{DD}$.

Figure 10:
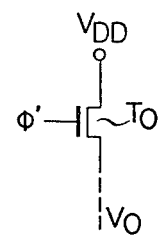
FIG. 10 is a circuit diagram of another voltage supply means according to this invention.

FIG. 10 shows another voltage supply means which may be used to supply voltage $V_0$ to the charging transistors $T_1$ to $T_m$ of the decoder circuit. On this voltage supply means a clock pulse $\phi'$ is supplied to the gate electrode of the power source transistor $T_0$.

Figure 11:
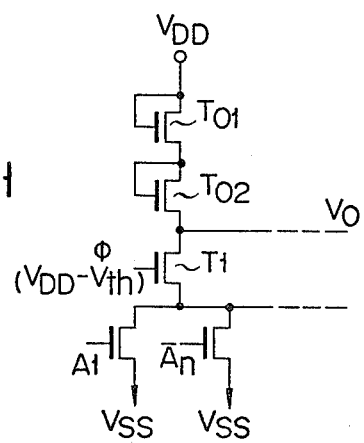
FIG. 11 is a circuit diagram of further voltage supply means according to this invention.

FIG. 11 shows still another voltage supply means which may be used to supply voltage $V_0$ to the charging transistors $T_1$ to $T_m$ of the decoder circuit. If "1" level voltage, e.g. "$V_{DD}-V_{th}$", which has a threshold loss is applied to the gate electrode of the charging transistor $T_1$ and the output voltage of the transistor $T_1$ is "$V_{DD}-2V_{th}$", two power source transistors $T_{01}$ and $T_{02}$ are provided and connected in series to each other.

Figure 12:
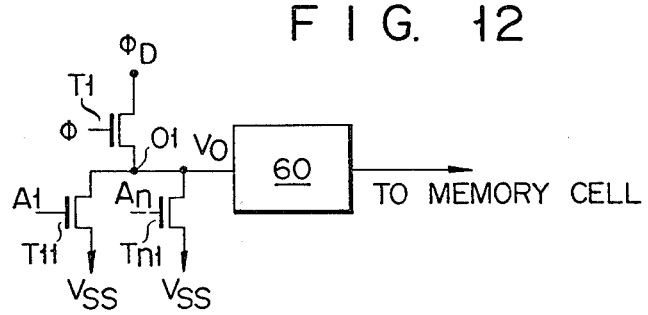
FIG. 12 is a circuit diagram of a decoder used in another embodiment of this invention.
Figure 13:
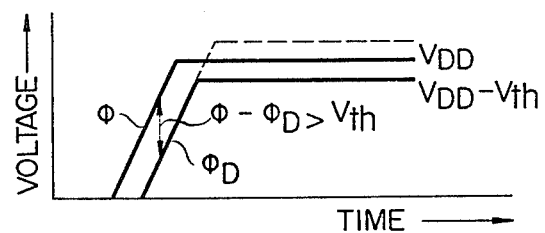
FIG. 13 is a waveform chart illustrating the relationship between a clock pulse $\phi$ and a pulse $\phi_D$ which are used in the decoder shown in FIG. 12.

FIG. 12 illustrates another decoder circuit, wherein a clock pulse $\phi$ is supplied to the gate electrode of a charging transistor $T_1$ of a decoder, and a pulse $\phi_D$ delayed with respect to the clock pulse $\phi$ is supplied to the drain electrode of the transistor $T_1$. The charging transistor $T_1$ is driven by the clock pulse $\phi$ whose "1" level voltage is a high power source voltage $V_{DD}$. It is sufficient that the clock pulse $\phi$ and the pulse $\phi_D$ have such a phase difference that, as shown in FIG. 13, they have at a certain time a potential difference greater than the threshold voltage $V_{th}$ of the transistor $T_1$. If the "1" level voltage of the clock pulse $\phi$ is $V_{DD}$, the ultimate "1" level voltage of the pulse $\phi_D$ should preferably be "$V_{DD}-V_{th}$". The "1" level voltage of the pulse $\phi_D$ may be more than "$V_{DD}-V_{th}$" as indicated in FIG. 13 by a broken line if the charging transistor $T_1$ has such a conductance that the decoder output voltage $V_0$ is elevated to about "$V_{DD}-V_{th}$" when the pulse $\phi_D$ reaches the level "$V_{DD}-V_{th}$".

In the decoder circuit shown in FIG. 12, the gate voltage of the charging transistor $T_1$ is always higher than the drain voltage by the threshold voltage $V_{th}$ of the transistor $T_1$. The charging transistor $T_1$, therefore, operates in a triode regions all the time. As a result, the decoder circuit does not degrade the charge retention characteristic of the MOS-IC in which it is provided.

Figure 14:
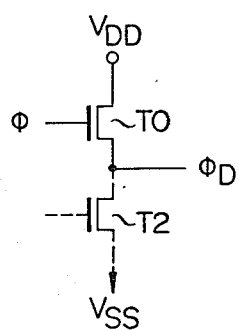
FIG. 14 is a circuit diagram of means for generating the pulse $\phi_D$.

The pulse $\phi_D$ supplied to the drain electrode of the charging transistor $T_1$ of the decoder circuit shown in FIG. 12 may be generated by such pulse generating circuit as illustrated in FIG. 14. The pulse generating circuit comprises a power source transistor $T_0$ whose drain electrode is connected to a power source $V_{DD}$. The gate electrode of the power source transistor $T_0$ is connected to receive a clock pulse $\phi$ for charging the decoder circuit. The source output of the transistor $T_0$ is used as a pulse $\phi_D$ to be supplied to the drain electrode of the charging transistor $T_1$. Since the source output $\phi_D$ has a level which is at least the level of the clock pulse $\phi$ minus the threshold voltage $V_{th}$ of the transistor $T_1$, the clock pulse $\phi$ and the pulse $\phi_D$ have such a phase difference as shown in FIG. 13. The pulse generating circuit further comprises a discharging transistor $T_2$, which may be omitted. The power source transistor $T_0$ operates always in a pentode region and the current flowing through it is large. Thus it is necessary to locate the transistor $T_0$ at a distance of about 500μ from the charge retention portion of the MOS-IC in which the decoder circuit is provided, or to form a diffusion layer to surround the transistor $T_0$ and apply a high voltage, e.g. $V_{DD}$, on the diffusion layer.

Figure 15:
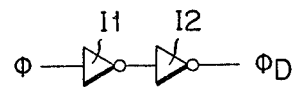
FIG. 15 is a circuit diagram of a modification of the means shown in FIG. 14.

FIG. 15 shows another pulse generating circuit which is a delay circuit. This circuit comprises two inverters $I_1$ and $I_2$ which are cascade-connected. Thus the circuit delivers a pulse $\phi_D$ delayed with respect to a clock pulse $\phi$ by the delay time of the inverters $I_1$ and $I_2$.

Figure 16:
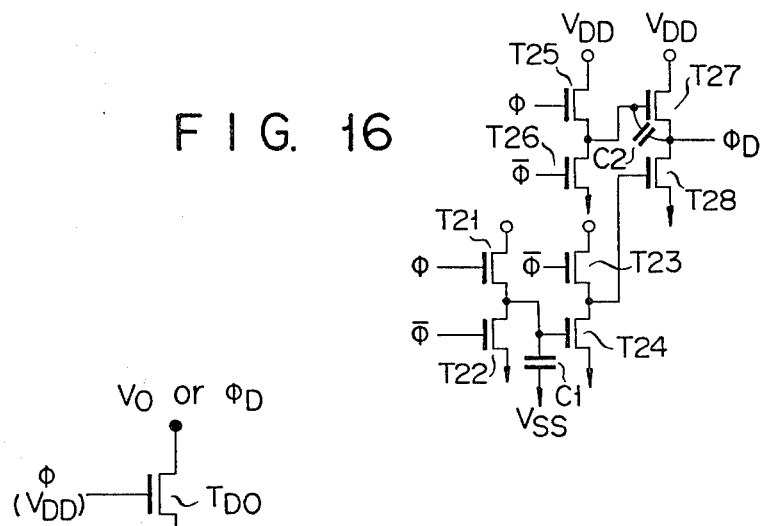
FIG. 16 is a circuit diagram of another modification of the means shown in FIG. 14.

Alternatively, use may be made of such a dynamic pulse generating circuit as illustrated in FIG. 16. This circuit, which is disclosed in U.S. Pat. No. 3,898,479, comprises enhancement type transistors $T_{21}$ to $T_{28}$ and capacitors $C_1$ and $C_2$. A clock pulse $\phi$ is supplied to some of the transistors, and a reset pulse $\overline{\phi}$, which is inverted with respect to the clock pulse $\phi$, is supplied some other transistors. The transistors $T_{21}$ to $T_{24}$ and the capacitor $C_1$ constitute a delay circuit which delays the timing of turning the transistor $T_{28}$ on and off. During this delay time the capacitor $C_2$ is charged to raise the gate voltage of the transistor $T_{27}$ which functions as an output transistor. As a result, a delayed pulse $\phi_D$ whose voltage level ranges from a low power source voltage $V_{SS}$ to a high power source voltage $V_{DD}$ may be produced.

The above-mentioned power source transistor $T_0$ for supplying voltage $V_0$ and the above-mentioned circuits for supplying pulses $\phi_D$ can be in common used to supply voltage $V_0$ and pulses $\phi_D$ not only to the charging transistors of the decoder circuit but also to other charging transistors which are formed close to the charge retention portion and charged with a threshold loss.

Figure 17:
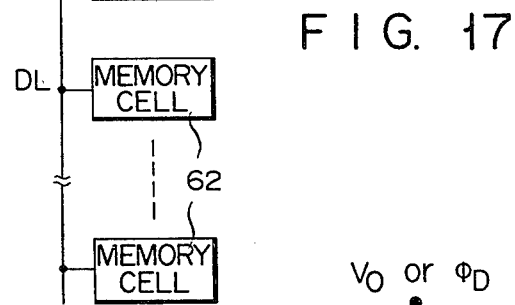
FIG. 17 is a block diagram of an embodiment of this invention, wherein a charging transistor is used to charge one output data line.
Figure 18:
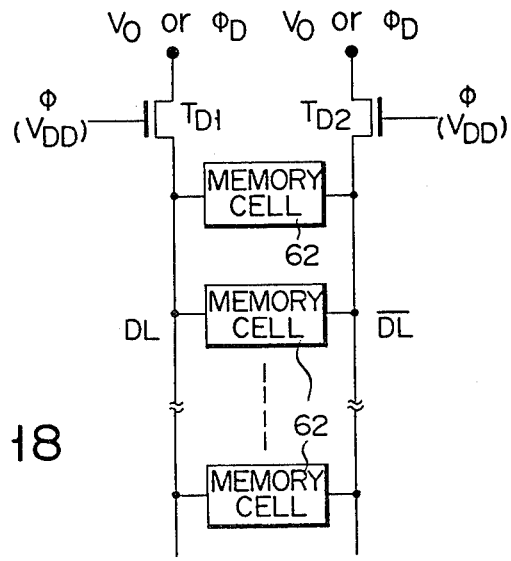
FIG. 18 is a block diagram of another embodiment of this invention, wherein charging transistors are used to charge complementary output data lines.
Figure 19:
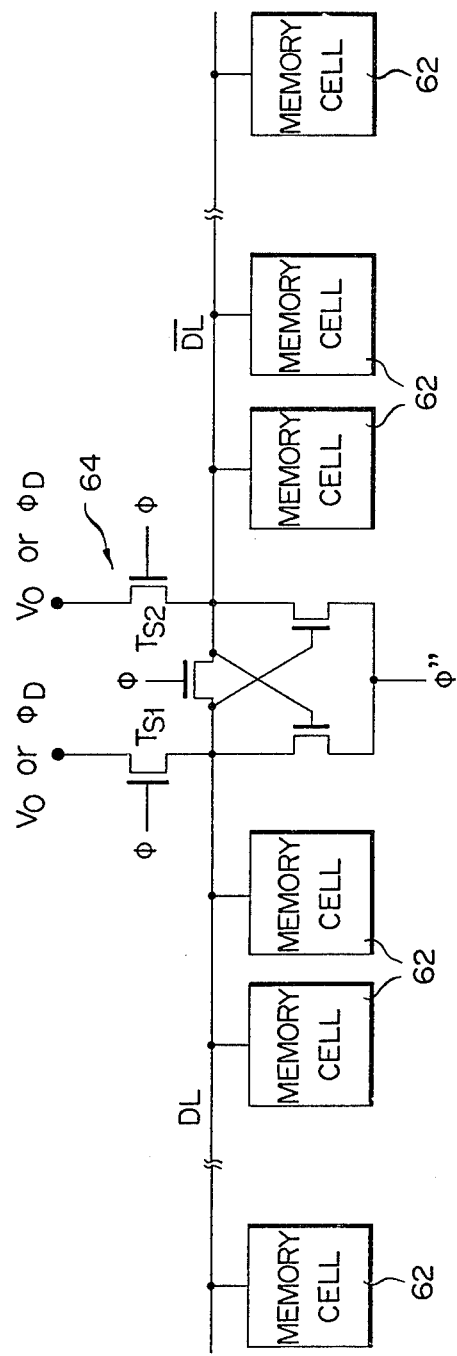
FIG. 19 is a block diagram of still another embodiment of this invention, wherein charging transistors are used to charge a sense amplifier.

Using the power source transistor $T_0$ or the pulse generating circuits, voltage $V_0$ or a pulse $\phi_D$ may be in common supplied to a charging transistor $T_{D0}$ connected to an output data line DL to which memory cells 62 are connected as illustrated in FIG. 17, charging transistors $T_{D1}$ and $T_{D2}$ connected to complementary output data lines DL and $\overline{DL}$ to which memory cells 62 are connected as illustrated in FIG. 18 and charging transistors of a sense amplifier 64 are connected as shown in FIG. 19.

Figure 20:
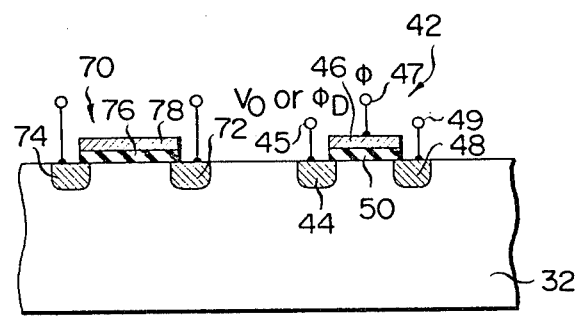
FIG. 20 is a cross sectional view of an embodiment of this invention, wherein a floating gate is provided in a charge retention portion.

FIG. 20 shows another embodiment of this invention, i.e. a MOS-IC such as a MOS type EPROM (electrically programmable read only memory) which has a charge retention portion 70 for retaining charge in an insulative film 76 or in a conductor 78 (so-called "floating gate") formed within the insulative film 76. The MOS-IC of FIG. 20 differs in structure from the aforementioned embodiments wherein the charge retention portion is a dynamic MOS-IC or a MOS-IC for retaining charge by means of high-resistance resistors. The charge retention characteristics of the MOS-IC shown in FIG. 20 may be degraded if a peripheral circuit to the charge retention portion 70 includes a MOS transistor 42 which corresponds to the charging transistor $T_1$ of the decoder circuit shown in FIG. 5 and which operates in a pentode region. To prevent the charge retention characteristics from being degraded, voltage $V_0$ or a pulse $\phi_D$ is supplied to the drain electrode 45 of the MOS transistor 42 and power source voltage $V_{DD}$ or a clock pulse $\phi$ is supplied to the gate electrode of the MOS transistor 42. This measures taken, the MOS-IC will operate with an improved reliability.

Figure 21:
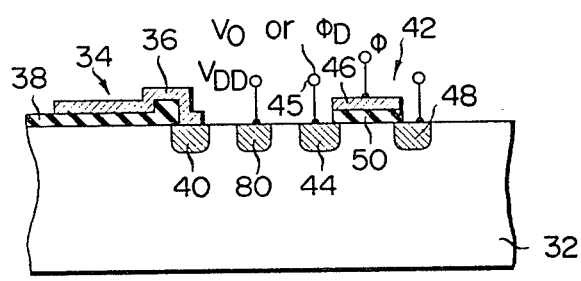
FIGS. 21 and 22 are cross sectional views of MOS-ICs provided with a layer for absorbing minority carriers.
Figure 22:
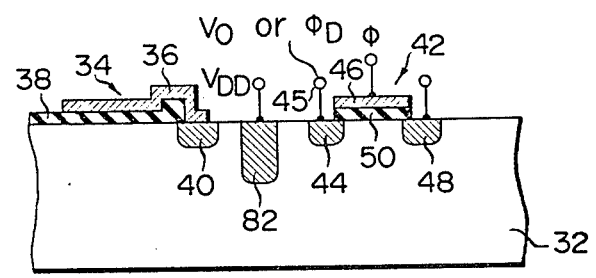

FIGS. 21 and 22 show other MOS-ICs according to this invention. In the MOS-IC of FIG. 21 a diffusion layer 80 is formed in a substrate 32 to surround a charge retention portion 34. The diffusion layer 80 has the conductivity type opposite to that of the substrate 32. The highest voltage available in the MOS-IC, e.g. power source voltage $V_{DD}$, is applied on the diffusion layer 80, thereby trapping in the layer 80 the minority carriers coming from a MOS transistor 42 of a peripheral circuit. In the MOS-IC of FIG. 22, a diffusion layer 82 is formed in a substrate 32 to surround a charge retention portion 34. The diffusion layer 82 has the conductivity type opposite to that of the substrate 32. The highest voltage available in the MOS-IC, e.g. power source voltage $V_{DD}$, is supplied to the diffusion layer 82, thus trapping in the layer 82 the minority carriers coming from a MOS transistor 42 of a peripheral circuit. In either MOS-IC the object of this invention is successfully accomplished.

What is claimed is:

1. A MOS integrated circuit device comprising:
    a plurality of charge retention circuit elements formed on a semiconductor substrate;
    a peripheral circuit for operation of said charge retention circuit elements having charging transistors which provide logic signals at their source electrodes, said charging transistors being formed on the semiconductor substrate and positioned near to the charge retention circuit elements, a first voltage being applied to the gate electrodes of said charging transistors; and
    voltage supply means formed on the semiconductor substrate for supplying a second voltage to the drain electrodes of said charging transistors, said second voltage cooperating with said first voltage to operate the charging transistors in a triode region for a predetermined time thereby to prevent the charge retention characteristics of the charge retention circuit elements from being degraded.

2. A MOS integrated circuit device comprising:
    a plurality of charge retention circuit elements formed on a semiconductor substrate;
    a peripheral circuit for operation of said charge retention circuit elements having charging transistors which provide logic signals at their source electrodes, said charging transistors being formed on the semiconductor substrate and positioned near to the charge retention circuit elements, a logic one level voltage being applied to the gate electrodes of said charging transistors for a predetermined time; and
    voltage supply means formed on the semiconductor substrate for supplying to the drain electrodes of said charging transistors a voltage which is lower than the logic one level voltage by about the threshold voltage of the charging transistors to operate said charging transistors in a manner which prevents the charge retention characteristics of the charge retention circuit elements from being degraded, and with a plurality of said charging transistors coupled to one voltage supply means to minimize the number of minority carriers introduced into said substrate.

3. A MOS integrated circuit device according to claim 2, wherein said voltage supply means includes a voltage supply terminal coupled to at least one MOS transistor.

4. A MOS integrated circuit device according to claim 3, wherein said MOS transistor has its gate electrode connected to its drain electrode and its source electrode connected to the drain electrodes of the charging transistors.

5. A MOS integrated circuit device according to claim 3, wherein the gate electrode of said MOS transistor is connected to a logic are level voltage source through a resistance element, and the drain-source current path of said MOS transistor is connected between said voltage supply terminal and said drain electrodes of said charging transistors.

6. A MOS integrated circuit device according to claim 3, wherein the gate electrode of said MOS transistor is supplied with a clock signal whose logic are level is a high power source voltage, and the drain-source current path of said MOS transistor is connected between said voltage supply terminal and said drain electrodes of said charging transistors.

7. A MOS integrated circuit device according to claim 3, wherein said logic one level voltage supplied to gate electrodes of the charging transistors is lower than a high power source voltage by the threshold voltage of the charging transistors, and wherein said voltage supply means comprises a first MOS transistor and a second MOS transistor, said first MOS transistor having its drain electrode connected to a high power source, its source electrode connected to the drain electrode of said second MOS transistor and its gate electrode connected to its own drain electrode, and said second MOS transistor having its source electrode connected to the drain electrodes of the charging transistors and its gate electrode connected to its own drain electrode.

8. A MOS integrated circuit device according to claim 3, wherein said MOS transistor has an electric transconductance which is greater than that of the charging transistors.

9. A MOS integrated circuit device comprising:
    a plurality of charge retention circuit elements formed on a semiconductor substrate;
    a peripheral circuit for operation of said charge retention circuit elements having charging transistors which provide logic signals at their source electrodes, said charging transistors being formed on the semiconductor substrate and positioned near to the charge retention circuit elements, a first pulsative voltage being applied to the gate electrodes of said charging transistors; and voltage supply means formed on the semiconductor substrate for supplying a second pulsative voltage to the drain electrodes of said charging transistors, said first pulsative voltage being higher during its rising period than the second pulsative voltage by the threshold voltage of the charging transistors to operate said charging transistors in a manner which prevents the charge retention characteristics of the charge retention circuit elements from being degraded, and with a plurality of said charging transistors coupled to one voltage supply means to minimize the number of minority carriers introduced into said substrate.

10. A MOS integrated circuit device according to claim 9, wherein said voltage supply means comprises a voltage supply terminal for receiving said second pulsative voltage and a MOS transistor which receives the first pulsative voltage at the gate electrode and which operates in a pentode region, and the drain-source current path of said MOS transistor is connected between said voltage supply terminal and said drain electrodes of said charging transistors.

11. A MOS integrated circuit device according to claim 10, wherein the drain electrode of said MOS transistor is connected to receive a high power source voltage.

12. A MOS integrated circuit device according to claim 9, wherein said voltage supply means is a pulse generating circuit for generating a pulse which is delayed with respect to the first pulsative voltage.

13. A MOS integrated circuit device according to claim 12, wherein said pulse generating circuit comprises a first inverter and a second inverter which are cascade-connected and is supplied with the first pulsative voltage and apply an output pulse to the drain electrodes of the charging transistors.

14. A MOS integrated circuit device according to claim 12, wherein said pulse generating circuit is a dynamic pulse generator comprising a plurality of transistors having source electrodes, gate electrodes and drain electrodes, the drain electrode of a first transistor being connected to receive a high power source voltage, the source electrode of the first transistor being connected to the drain electrode of a second transistor and held at the same potential as the drain electrode of the second transistor, the source electrode of the second transistor being connected to a low power source voltage, the gate electrode of the first transistor being coupled to the source electrode of the first transistor through a capacitor, the drain electrode of a third transistor being connected to receive the high power source voltage, the source electrode of the third transistor being connected to the drain electrode of a fourth transistor, held at the same potential as the drain electrode of the fourth transistor and connected also to the gate electrode of the first transistor, the source electrode of the fourth transistor being connected to the low power source voltage, the gate electrode of the third transistor being connected to receive a first clock pulse, the gate electrode of the fourth transistor being connected to receive a second clock pulse which is inverted with respect to the first clock pulse, the drain electrode of a fifth transistor being connected to receive the high power source voltage, the source electrode of the fifth transistor being connected to the drain electrode of a sixth transistor, held at the same potential as the drain electrode of the sixth transistor and connected also to the gate electrode of the second transistor, the source electrode of the sixth transistor being connected to the low power source voltage, the gate electrode of the fifth transistor being connected to receive said second clock pulse, the drain electrode of a seventh transistor being connected to receive the high power source voltage, the source electrode of the seventh transistor being connected to the drain electrode of an eighth transistor, held at the same potential as the drain electrode of the eighth transistor and connected also to the gate electrode of the sixth transistor and also to the low power source voltage through a capacitor, the source electrode of the eighth transistor being connected to the low power source voltage, the gate electrode of the seventh transistor being connected to receive the first clock pulse, the gate electrode of the eighth transistor being connected to receive the second clock pulse, and node where the first and second transistors are connected delivering an output pulse.

15. A MOS integrated circuit device according to any one of the preceding claims, wherein said charging transistors are connected to single-output data lines.

16. A MOS integrated circuit device according to any one of claims 1 to 14, wherein said charging transistors are connected to complementary-output data lines.

17. A MOS integrated circuit device according to any one of claims 1 to 14, wherein said charging transistors are to drive sense amplifiers.

18. A MOS integrated circuit device according to any one of claims 1 to 14, wherein said charging transistors are positioned at a distance from the charge retention circuit elements, said distance being about ten times as long as the diffusion length of minority carriers in said semiconductor substrate.

19. A MOS integrated circuit device according to any one of claims 1 to 14, wherein said charging transistors are positioned within about 500μ from the charge retention circuit elements.

20. A MOS integrated circuit device according to any one of claims 1 to 14, wherein said charging transistors are of enhancement type.

21. A MOS integrated circuit device according to any one of claims 1 to 14, wherein said charge retention circuit elements retain charge dynamically.

22. A MOS integrated circuit device according to any one of claims 1 to 14, wherein said charge retention circuit elements retain charge with assistance of a resistor having a resistance of at least 10 mΩ.

23. A MOS integrated circuit device according to any one of claims 1 to 14, wherein said charge retention circuit elements comprise floating gate memory transistors.

24. A MOS integrated circuit device according to any one of claims 1 to 14, wherein a minority carrier absorbing region is formed in the semiconductor substrate to surround at least one portion of said voltage supply means.

25. A MOS integrated circuit device according to any one of claims 1 to 14, wherein said voltage supply means is positioned at a distance from the charge retention circuit elements, said distance being about ten times longer than the diffusion length of minority carriers in said semiconductor substrate.

26. A MOS integrated circuit device according to any one of claims 1 to 14, wherein said voltage supply means is positioned at a distance from the charge retention circuit elements, said distance being longer than about 500μ.

27. A MOS integrated circuit device according to claim 26, wherein a minority carrier absorbing region is formed in the semiconductor substrate to surround at least one portion of said voltage supply means.

28. A MOS integrated circuit device according to claim 24, wherein said minority carrier absorbing region is formed so as to surround entirely the voltage supply means.

29. A MOS integrated circuit device according to claim 27, wherein said minority carrier absorbing region is formed as as to surround entirely the voltage supply means.

* * * * *

UNITED STATES PATENT AND TRADEMARK OFFICE
CERTIFICATE OF CORRECTION

PATENT NO. : 4,433,257
DATED : February 21, 1984
INVENTOR(S) : Kinoshita

It is certified that error appears in the above—identified patent and that said Letters Patent is hereby corrected as shown below:

In the title, change "CHANGING" to --CHARGING--.

Claim 5, line 29, change "logic are" to --logic one--.

Claim 6, line 36, change "logic are" to --logic one--.

Signed and Sealed this

Twenty-second Day of May 1984

[SEAL]

Attest:

GERALD J. MOSSINGHOFF

Attesting Officer

Commissioner of Patents and Trademarks